United States Patent
Ohashi

(10) Patent No.: US 7,031,685 B2
(45) Date of Patent: Apr. 18, 2006

(54) RECEIVER FOR REGENERATING A SIGNAL WAVE VIA DIGITAL SIGNAL PROCESSING

(75) Inventor: Toru Ohashi, Saitama (JP)

(73) Assignee: Pioneer Corporation, Tokyo (JP)

( * ) Notice: Subject to any disclaimer, the term of this patent is extended or adjusted under 35 U.S.C. 154(b) by 897 days.

(21) Appl. No.: 09/900,133

(22) Filed: Jul. 9, 2001

(65) Prior Publication Data

US 2002/0016159 A1    Feb. 7, 2002

(30) Foreign Application Priority Data

Jul. 7, 2000    (JP)    ............ P. 2000-206696

(51) Int. Cl.
*H04B 1/06* (2006.01)
*H04B 1/10* (2006.01)
*H04B 7/00* (2006.01)

(52) U.S. Cl. ............ 455/234.1; 375/345; 375/346; 455/296

(58) Field of Classification Search ............ 329/347; 348/678, 683, 725; 375/345, 346; 455/232.1, 455/234.1, 235.1, 240.1, 296, 234.2
See application file for complete search history.

(56) References Cited

U.S. PATENT DOCUMENTS

| | | | |
|---|---|---|---|
| 3,806,646 A | * | 4/1974 | Hofmann ............ 348/678 |
| 4,000,369 A | * | 12/1976 | Paul et al. ............ 704/228 |
| 4,600,890 A | * | 7/1986 | Horvat ............ 329/319 |
| 4,654,885 A | | 3/1987 | Meszko et al. |
| 4,829,593 A | * | 5/1989 | Hara ............ 455/234.2 |
| 5,133,009 A | * | 7/1992 | Rumreich ............ 380/221 |
| 5,465,407 A | * | 11/1995 | Hashimoto ............ 455/234.2 |
| 5,737,035 A | * | 4/1998 | Rotzoll ............ 348/725 |
| 5,771,297 A | | 6/1998 | Richardson |
| 5,917,865 A | * | 6/1999 | Kopmeiners et al. ....... 375/345 |

FOREIGN PATENT DOCUMENTS

EP    0 208 082 A2    1/1987

* cited by examiner

*Primary Examiner*—Harry S. Hong
(74) *Attorney, Agent, or Firm*—Sughrue Mion, PLLC

(57) ABSTRACT

Detection output from a detection circuit 17 is converted to digital detection data D1 and supplied to an AGC circuit AGCC and a noise clamping circuit NCC that are formed by digital circuits. In the AGC circuit AGCC, a digital low pass filter 19 generates DC voltage data D2 from the detection data D1. A digital divider 20 performs division of the DC voltage data D2 by the reference detection level data D3 indicating the detection data level. A digital multiplier multiplies the division results D4 by the detection data D1 to generate multiplication data D5 that is constant irrespective of a variation in the detection data D1. In the noise clamping circuit NCC, a digital comparator 23 compares the size of the preset voltage data D6 and that of the multiplication data D5. A selector circuit 24 selectively outputs preset voltage data D6 or multiplication data D5 to generate signal wave data $D_{AF}$.

6 Claims, 3 Drawing Sheets

(IN THIS CASE, DECIMAL '100' IS SHIFTED
BY A SINGLE BIT TO OUTPUT DECIMAL '200')

RECEIVER FOR REGENERATING A SIGNAL WAVE VIA DIGITAL SIGNAL PROCESSING

BACKGROUND OF THE INVENTION

1. Technical Field

The present invention relates to a receiver for regenerating a signal wave from a received wave, and in particular to a receiver for regenerating a signal wave via digital signal processing.

2. Related Art

Conventionally, an AM receiver of the superheterodyne system shown in FIG. 3 is known as a receiver for receiving a broadcast wave transmitted from a broadcast station and regenerating a signal wave in the audio frequency band.

The AM receiver regenerates a signal wave $S_{AF}$ via analog signal processing. The receiver supplies the AM broadcast wave $S_{AF}$ received by an antenna 1 to a frequency converter 3 via a high-frequency amplifier 2 and mixes the signal with a channel selection signal $S_o$ of the local oscillation frequency from a local oscillator 4 in order to frequency-convert the signal to a signal of the intermediate frequency (455 kHz), hereinafter referred to as an IF signal. The AM receiver removes unwanted frequency components by passing the frequency-converted IF signal $S_{IF}$ through a band-pass filter 5 in the intermediate frequency band, amplifies the resulting signal via a gain control intermediate frequency amplifier 6, removes external noises via a noise clamping circuit 7, then detects the signal via a detection circuit 8 to regenerate a signal wave $S_{AF}$ in the audio frequency band. The AM receiver voltage-splits the signal wave $S_{AF}$ via fixed resistors 10, 11 of predetermined values and outputs the resulting signal.

Further, the AM receiver converts the signal wave $S_{AF}$ detected by the detection circuit 8 converts to a DC voltage $V_{AGC}$ via a low pass filter 9 to obtain a constant (non-variable) signal wave $S_{AF}$.

Assuming the amplification ratio of the gain control intermediate frequency amplifier 6 is fixed, a variation in the amplitude of the AM broadcast wave $S_{RF}$ in accordance with a variation in the receiving intensity causes a variation in the signal wave $S_{AF}$ even in case the AM broadcast wave $S_{RF}$ of the same detection data level is detected.

In order to prevent such a disadvantage, a constant (non-variable) signal wave $S_{AF}$ is obtained by lowering the amplification ratio of the gain control intermediate frequency amplifier 6 when a DC voltage VAGC is raised, and by raising the amplification ratio of the gain control intermediate frequency amplifier 6 when the DC voltage $V_{AGC}$ is lowered.

[Problems that the Invention is to Solve]

The inventor of the application has replaced a received composed of the aforementioned analog circuits with one composed of digital circuits to make an attempt to directly regenerate the digital signal wave $S_{AF}$ that is compatible with for example digital audio apparatus.

More precisely, the inventor has digitized a receiver itself, without providing an additional feature whereby an analog signal wave $S_{AF}$ output from the detection circuit 8 in FIG. 3 is converted to a digital signal wave via an A/D converter, thus directly outputting a digital signal wave $S_{AF}$. The inventor, in doing so, has attempted to develop a more high-accuracy receiver that was not available via an analog receiver.

The inventor, as one of such attempts, has proposed to implement high-accuracy signal processing obtained through digital arithmetic operation, by replacing the gain control intermediate frequency amplifier 6, the noise clamping circuit 7 and the low pass filter 9 with digital circuits.

The proposal presented a problem. While frequency of each signal supplied to the gain control intermediate frequency amplifier 6, the noise clamping circuit 7 and the low pass filter 9 is down-converted to an intermediate frequency (455 kHz) via the frequency conversion in the frequency converter 3, the frequency is too high for general digital circuits to process. This requires introduction of extremely high-speed digital circuits, not just replacement of existing circuits.

In order to perform the digital signal processing equivalent to that in the gain control intermediate frequency amplifier 6, the noise clamping circuit 7 and the low pass filter 9 as analog circuits according to the related art, it is necessary to digitize the IF signal $S_{IF}$ output from the band-pass filter at a sampling frequency at least double the intermediate frequency (455 kHz), for example a sampling frequency of 1 MHz according to the Nyquist sampling theorem.

Thus, there was a problem that high-speed and expensive digital circuits were required, which made it difficult to digitize a receiver.

For example, an approach for high-speed digital signal processing provides a plurality of digital circuits that can perform high-speed arithmetic operation in parallel and implements substantial high-speed arithmetic operation through parallel processing using these plurality of digital circuits. This approach requires complicated control for obtaining precise synchronization between digital circuits and invites high costs due to expanded circuit scale.

The invention aims at solving the problems involved in the related art and providing a new receiver of a simple configuration that can directly output high-accuracy digital signal waves.

SUMMARY OF THE INVENTION

[Means for Solving the Problems]

The invention, in order to attain the object, proposes a receiver for regenerating a signal wave from a received wave that is amplitude-modulated, characterized in that the receiver comprises a variable gain control means for performing variable gain adjustment of detection data generated by detection of the received wave that is frequency-converted to an intermediate frequency signal to detection data having a constant level via digital signal processing, and a noise clamping means for performing noise clamping of the detection data having a constant level output from the variable gain control means via digital signal processing.

According to such a configuration, the variable gain control means and the noise clamping means perform digital signal processing on detection data having a frequency lower than that of the intermediate frequency signal. Thus, it is possible to configure variable gain control means and noise clamping means without applying high-speed digital circuits and to implement a new receiver of a simple configuration that can directly output high-accuracy digital signal waves.

The receiver is characterized in that the variable gain control means comprises a digital low pass filter for integrating detection data to generate DC component data, a digital divider for dividing predetermined first reference data to indicate a detection data level by the DC component data generated by the digital low pass filter, and a digital multiplier for multiplying division data output from the digital divider via the division by the detection data to generate the detection data having a constant level.

According to the configuration, division data corresponding to a variation in the detection data is generated when the digital divider divides the DC component data by the predetermined first reference data, and the detection data having a constant level is generated when the digital multiplier multiplies the division data and the detection data. This implements a so-called AGC circuit for keeping detection data constant via digital signal processing irrespective of a variation in detection data.

The receiver is characterized in that the noise clamping means comprises a digital comparator for comparing predetermined second reference data to indicate a clamp level with the detection data having a constant level and outputting the comparison results, and a selector circuit for outputting the detection data having a constant level as the data for the signal wave when the detection data having a constant level is smaller than the second reference data, and outputting the second reference data as the data for the signal wave when the detection data having a constant level is larger than the second reference data.

According to such a configuration, even in case a large noise exceeding the detection data level is superimposed on the detection data having a constant level output from the variable gain control means, the detection data having a constant level with the noise removed is generated.

The receiver is further characterized in that the receiver comprises a digital multiplier for multiplying the first reference data by a predetermined scale factor so that the second reference data is generated.

According to such a configuration, setting just the first reference data generates the second reference data of a predetermined scale factor. This simplifies operation for data setting.

DEITALED DESCRIPTION OF THE
PREFERRED EMBODIMENTS

[Mode for Carrying Out the Invention]

Figure 1:
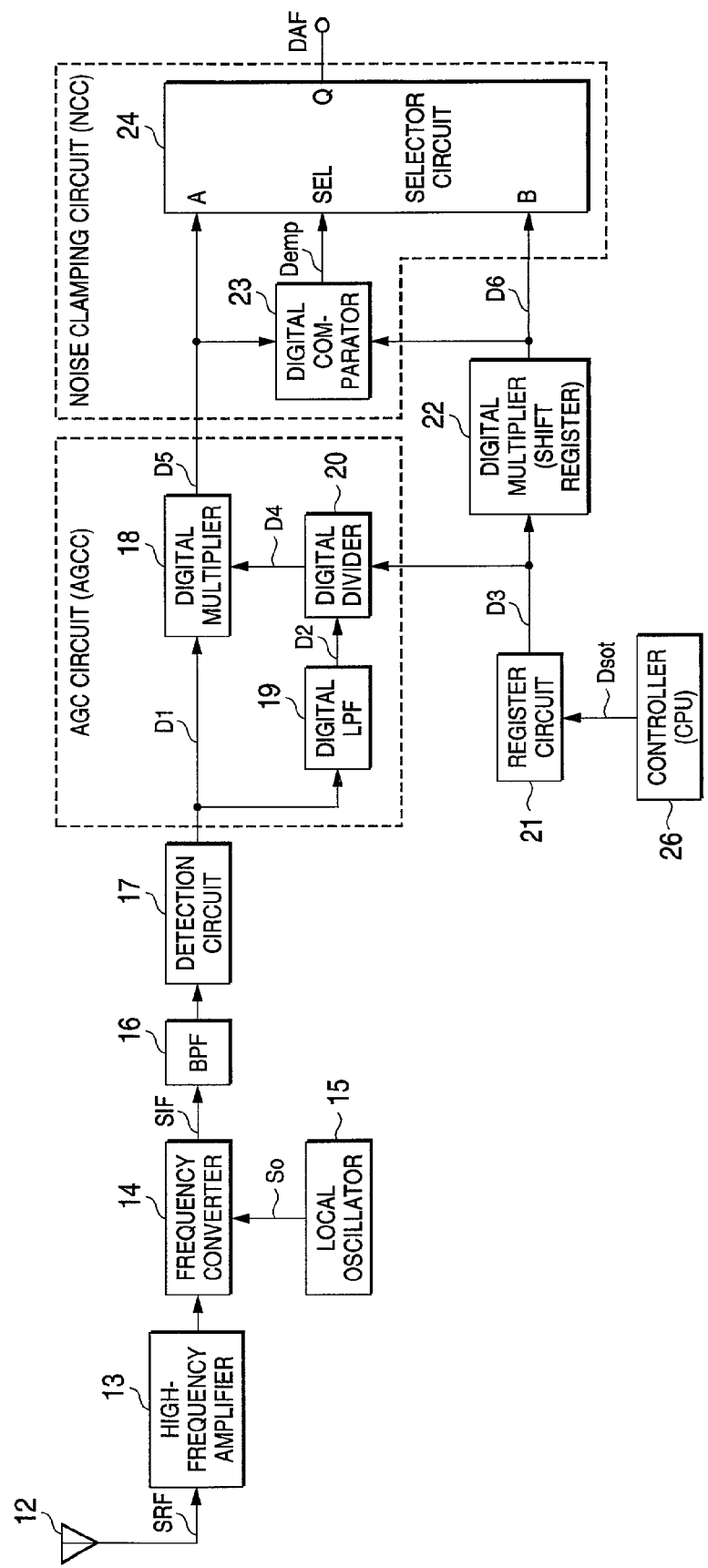
FIG. 1 is a block diagram showing a configuration of a receiver according to the embodiment.

An embodiment of the invention will be described referring to drawings. FIG. 1 is a block diagram showing a configuration of a receiver according to the embodiment. In this embodiment is shown a receiver for receiving AM broadcast waves.

The receiver in FIG. 1 supplies an AM broadcast wave $S_{RF}$ received via an antenna 12 to a frequency converter 14 via a high-frequency amplifier 13, mixes the resulting signal with a channel selection signal $S_o$ of the local oscillation frequency from a local oscillator 15 in order to frequency-convert the signal to an IF signal $S_{IF}$ of the intermediate frequency (455 kHz), removes unwanted frequency components by passing the IF signal $S_{IF}$ through a band-pass filter 16 in the intermediate frequency band, then detects the signal via a detection circuit 17 to generate a detection signal in the audio frequency band.

The high-frequency amplifier 13, the frequency converter 14, the band-pass filter 16 and the detection circuit 17 are formed of analog circuits.

Following the detection circuit 17 are serially connected an AGC (Automatic Gain Control) circuit AGCC as variable gain control means and a noise clamping circuit NCC as noise clamping means.

Although not shown, an A/D converter is provided whereby the detection signal generated by the detection circuit 17 is sampled at a sampling frequency about double the audio frequency band (for example about 100 Hz to 20 kHz), for example a sampling frequency of 41 kHz to convert the detection signal to digital data (hereinafter referred to as detection data) D1. Detection data D1 output from the A/D converter is supplied to the AGC circuit AGCC.

The AGC circuit AGCC is composed of a digital multiplier 18, a digital low pass filter 19, and a digital divider 20.

The digital low pass filter 19 inputs detection data D1 and outputs DC voltage data D2 indicating a DC voltage proportional to the detection data D1 via digital filtering.

The digital divider 20 inputs DC voltage data D2 and reference detection level data D3 mentioned later, then performs division of data D2 by D3. The digital divider 20 supplies division data D4 obtained through the division to the digital multiplier 18, as shown in Expression (1).

[Expression 1]

$$D4=(K\times D2)\div 3 \quad (1),$$

where the coefficient K in Expression 1 is a proportion coefficient (constant) used by the digital low pass filter 19 for generating DC voltage data D2 by performing digital filtering (integration) on the detection data D1 based on a predetermined constant.

The digital multiplier 18 multiplies the detection data D1 and the division data D4 and outputs the multiplication data D5 obtained via the multiplication to the noise clamping circuit NCC.

The noise clamping circuit NCC is composed of a digital comparator 23 and a selector circuit 24.

The digital comparator 23 compares the value of the multiplication data D5 and the preset voltage data D6 mentioned later and outputs the comparison data $D_{cmp}$ as a comparison result. In case the value of the multiplication data D5 is smaller than the preset voltage data D6 (D5<D6), the digital comparator 23 outputs comparison data $D_{cmp}$ that is logically '1'. In case the value of the multiplication data D5 is equal to or larger than the preset voltage data D6 (D5≧D6), the digital comparator 23 outputs comparison data $D_{cmp}$ that is logically '0'.

The selector circuit 24 is composed of a so-called data multiplexer where multiplication data D5 is input to a first input terminal A, preset voltage data D6 is input to a second input terminal B, and comparison data $D_{cmp}$ is input to a select terminal SEL. When the comparison data $D_{cmp}$ is logically '1', the selector circuit 24 outputs the multiplication data D5 from an output terminal Q. When the comparison data $D_{cmp}$ is logically '0', the selector circuit 24 outputs the preset voltage data D6 from the output terminal Q. That is, the selector circuit 24 selects between the multiplication data D5 and the preset voltage data D6 according to the logical value of the comparison data $D_{cmp}$, and outputs the selected data as signal wave data $D_{AF}$.

The receiver is equipped with a register circuit 21, a multiplier 22 formed of a shift register, and a controller 25 having a microprocessor (MPU).

The controller 25 supplies reference data $D_{set}$ for setting the maximum span of the signal wave data $D_{AF}$ to the register circuit 21. The register circuit 21 maintains the reference data $D_{set}$ and supplies the reference data $D_{set}$ as reference detection level data D3 to the divider 20 and the multiplier 22.

The multiplier 22 is formed of for example a parallel-input parallel-output shift register. The multiplier 22, as shown in FIG. 2, outputs preset voltage data D6 that has a value equal to an integral multiple of the reference detection level data D3, by inputting the reference detection level data D3 and shifting the entire input data toward the higher bits by arbitrary number of bits.

Figure 2:
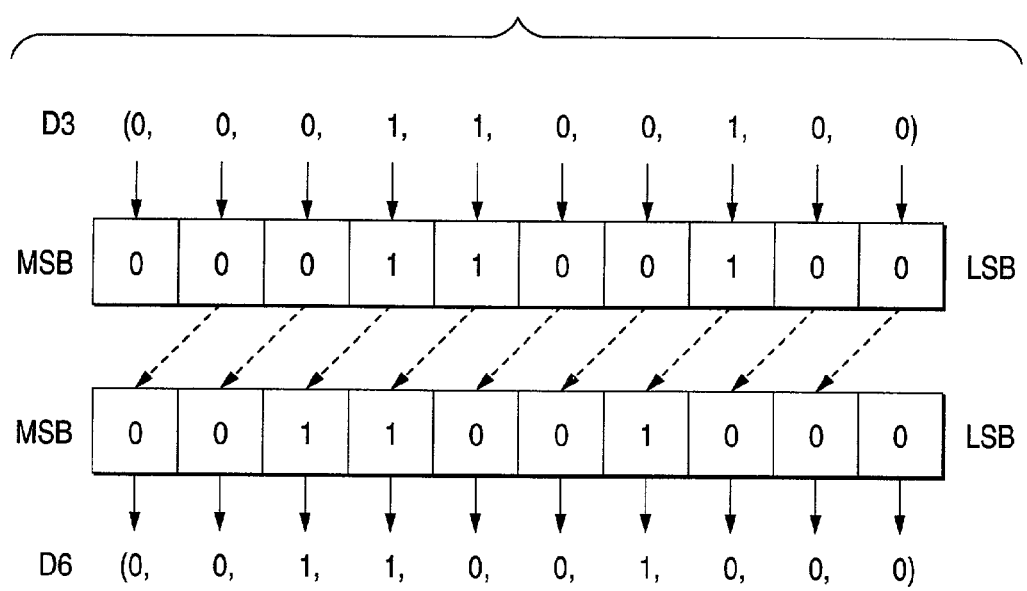
FIG. 2 shows the operation of a digital multiplier provided in the receiver according to the embodiment.
Figure 3:
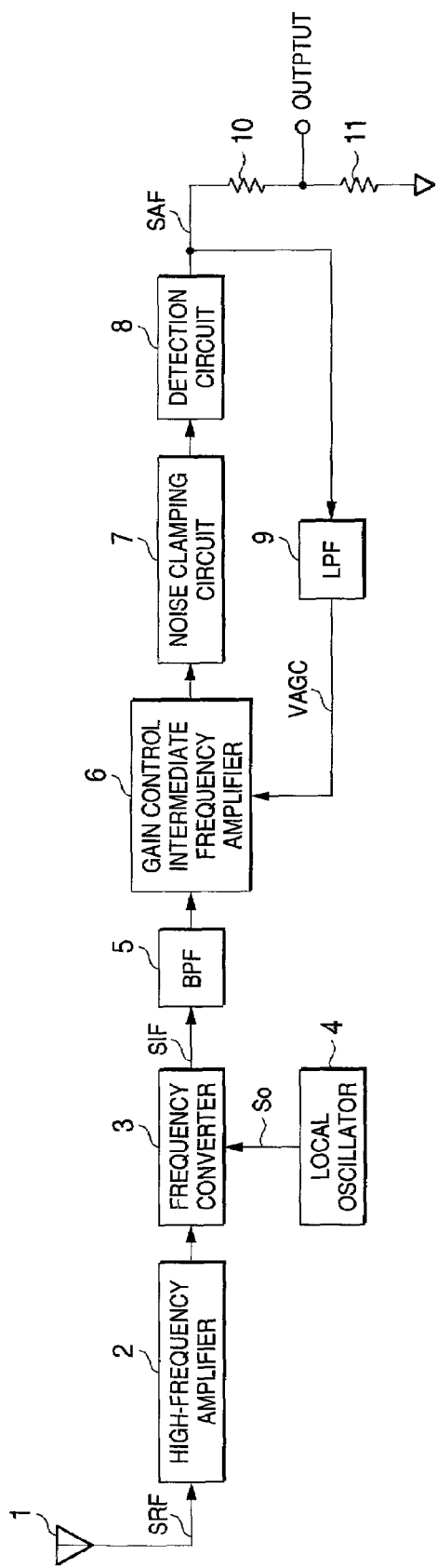
FIG. 3 is a block diagram showing a configuration of a receiver for regenerating a signal wave from a broadcast wave via the analog signal processing according to the related art.

FIG. 2 illustrates a case where the preset voltage data D6 that equals a value of decimal '200' is output by shifting the reference detection level data D3 when the data D3 is set to decimal '100'.

As detailed later, setting the detection level data D3 to decimal '100' causes the processing to be performed corresponding to the detection data level '100'.

Operation of the receiver having such a configuration according to the embodiment will be described below.

In the product inspection process of a receiver, an inspector operates the controller 25 to preset the reference data $D_{set}$ then performs product shipment. The inspector sets, for example, a value of decimal '100' to specify a detection data level of '100'.

When the user turns on the receiver and the antenna 12 receives a broadcast wave from a broadcast station, the AM broadcast wave $S_{RF}$ is high-frequency-amplified by the high-frequency amplifier 13, and mixed with the channel selection signal $S_o$ of the local oscillation frequency from the local oscillator 15 by the frequency converter 14 so that the resulting signal is frequency-converted (down-converted) to an IF signal $S_{IF}$ of the intermediate frequency (455 kHz). The IF signal $S_{IF}$ then passes through the band-pass filter 16 in the intermediate frequency band, detected by the detection circuit 17 to become a detection signal in the audio frequency band, converted to digital detection data D1 by the A/D converter that is not shown, then supplied to the AGC circuit AGCC.

In the AGC circuit AGCC, the digital low pass filter 19 generates DC voltage data D2 indicating a DC voltage proportional to the detection data D1. The digital divider 20 performs division of the DC voltage data D2 by the reference detection level data D3 from the register circuit 21 and supplies the resulting division data D4 to the digital multiplier 18. The digital multiplier 18 multiplies the detection data D1 by the division data D4 to generate and output multiplication data D5 (=D1×D4)

Note that the multiplication data 5 is kept constant even in case the detection data D1 varies with the receiving intensity of the AM broadcast wave $S_{RF}$.

For example, when the value of the detection data D1 (amplitude value) has changed to a value of decimal '40' in case reference detection level data D3 is set to decimal '100', the value of DC voltage data D2 becomes '40×K', division data D4 becomes D4=2.5×K, and multiplication data D5 becomes D5=100×K, all in proportion to the variation in the value of detection data D1, as shown in Expression (2).

In case the value of the detection data D1 (amplitude value) has changed to a value of decimal '80', data D2, D4, and D5 have values as shown in Expression (3).

In case the value of the detection data D1 (amplitude value) has changed to a value of decimal '160', data D2, D4, and D5 have values as shown in Expression (4).

[Expression 2]

$D3=100$ $D1=40$ $D2=40 \times K$ $D4=D3 \div D2=100 \div (40 \times K)=2.5 \times K$ $D5=D1 \times D4=40 \times (2.5 \times K)=100 \times K$ (2)

[Expression 3]

$D3=100$ $D1=80$ $D2=80 \times K$ $D4=D3 \div D2=100 \div (80 \times K)=1.25 \times K$ $D5=D1 \times D4=80 \times (1.25 \times K)=100 \times K$ (3)

[Expression 4]

$D3=100$ $D1=160$ $D2=160 \times K$ $D4=D3 \div D2=100 \div (160 \times K)=0.625 \times K$ $D5=D1 \times D4=160 \times (0.625 \times K)=100 \times K$ (4)

In this way, even in case the detection data D1 has varied with the receiving intensity of the AM broadcast wave $S_{RF}$, the AGC circuit AGCC performs gain control via digital signal processing to always keep constant and output the multiplication data D5.

Next, when the multiplication data D5 is supplied to the noise clamping circuit NCC, the digital comparator 23 compares the value of the multiplication data D5 and the preset voltage data D6 from the digital multiplier 22. The digital multiplier 22 supplies preset voltage data D6 indicating '200', double the reference detection level data D3 via the aforementioned bit shift.

Via such a configuration, in case D5<D6, comparison data $D_{cmp}$ that is logically '1' is supplied to the selector circuit 24, and in case D5≧D6, comparison data $D_{cmp}$ that is logically '0' is supplied to the selector circuit 24. Depending on the logical value of the comparison data $D_{cmp}$, the selector circuit 24 selectively outputs multiplication data D5 or preset voltage data D6 to generate signal wave data $D_{AF}$.

In case an external noise that exceeds the detection data level '200' determined by the preset voltage data D6 is superimposed on the multiplication data D5, the preset voltage data D6 is output as signal wave data $D_{AF}$. Otherwise, the multiplication data D5 is output as signal wave data $D_{AF}$.

Thus, the noise clamping circuit NCC is configured to generate signal wave data $D_{AF}$ with noises suppressed via digital signal processing.

In this way, according to the embodiment, configuring the AGC circuit AGCC and the noise clamping circuit NCC via digital circuits can provide a receiver that regenerates and directly outputs digital signal wave data $D_{AF}$.

In this configuration, a detection signal in the audio frequency range output from the detection circuit 17 is converted to detection data D1 by the A/D converter that is not shown, and the detection data D1 undergoes digital signal processing via the AGC circuit AGCC and the noise clamping circuit NCC. Thus it is not necessary to form the A/D converter, the AGC circuit AGCC and the noise clamping circuit NCC via high-speed digital circuits, thus preventing high costs for the receiver design.

That is, in case the gain control intermediate frequency amplifier 6, the noise clamping circuit 7 and the low pass filter 9 of the receiver in FIG. 2 described as the related art are replaced with digital circuits, it is necessary to process digital data at a sampling frequency at least double the intermediate frequency, for example a sampling frequency of 1 MHz considering an aliasing error in order to support the IF signal $S_{IF}$ of the intermediate frequency (455 kHz). Thus it is necessary to provide high-speed digital circuits. However, according to the embodiment, since a detection signal in the audio frequency range (for example 100 Hz to 20 kHz) is processed, the sampling frequency ca be set to as low as 41 kHz considering so-called reproducibility of a signal with an aliasing error suppressed, thereby eliminating the need for supplying high-speed digital circuits.

In case high-speed digital circuits according to the related art are applied, such problems arise that digital circuits are more complicated and high-accuracy and complicated synchronization control between digital circuits is required between digital circuits. According to the embodiment, low-speed digital signal processing is made possible thus eliminating the need for high-accuracy and complicated synchronization control and simplifying the circuit scale, thereby preventing high costs for the receiver design.

In the product inspection process of a receiver, an inspector has only to preset the reference data $D_{set}$ to the controller 25 to automatically determine the reference detection level data D3 that indicates the detection data level and the preset voltage data D6. This simplifies inspection and adjustment work as well as considerably reduces human errors such as misadjustment.

For example, in a receiver shown in FIG. 2, adjusting the detection level of the detection circuit 8 involves adjustment of the clamp level of the noise clamping circuit 7. This complicates the adjustment work thus easily causing human errors. According to the embodiment, such a drawback can be considerably offset.

While the embodiment assumes a case where the preset voltage data D6 double the reference detection level data D3 is automatically set when the digital multiplier 22 performs single-bit shift processing, the digital multiplier 22 may perform double-bit shift processing. Addition/subtraction of n-bit-shifted arbitrary data to/from m-bit-shifted arbitrary data may be used to automatically set an arbitrary value. For example, a combination of bit shift and addition/subtraction mat be used where addition of 1-bit-shifted arbitrary data to-1-bit-shifted arbitrary data is used to automatically set an arbitrary value.

While the embodiment assumes a case where the value of the reference data $D_{set}$ is set to decimal '100' corresponding to a detection data level of '100', the value of the reference data $D_{set}$ may be set arbitrarily.

While a digital multiplier 22 according to the embodiment generates preset voltage data D6 having a value equal to an integral multiple of the reference detection level data D3 by bit-shifting the reference detection level data D3 in order to further simplify the configuration of the receiver, a digital multiplier that performs multiplication without using the bit-shift processing.

For example, it is possible to supply multiplicand attribute data for specifying a scale factor from the controller 25 to the digital multiplier that performs multiplication without using the bit-shift processing and the digital multiplier may multiply the multiplicand attribute data by the reference detection level data D3 to generate the preset voltage data D6.

While the embodiment of an AM receiver for receiving a broadcast wave coming from a broadcast station is described, the invention is not limited to a receiver that regenerates a signal wave based on a broadcast wave.

While the embodiment assumes that circuits up to the detection circuit 17 are configured by analog circuits, the invention is not limited to this configuration. Any receiver that comprises an AGC circuit a noise clamping circuit that perform digital signal processing and falls within the scope of the invention.

[Advantages of the Invention]

As mentioned earlier, according to the invention, the variable gain control means and the noise clamping means perform digital signal processing on detection data having a frequency lower than that of the intermediate frequency signal. Thus, it is possible to configure variable gain control means and noise clamping means without applying high-speed digital circuits and to provide a new receiver of a simple configuration that can directly output high-accuracy digital signal waves.

The variable gain control means comprises a digital low pass filter for integrating detection data to generate DC component data, a digital divider for dividing predetermined first reference data by the DC component data generated by the digital low pass filter, and a digital multiplier for multiplying division data output from the digital divider via the division by the detection data to generate detection data having a constant level. This implements a so-called AGC circuit for keeping detection data constant via digital signal processing irrespective of a variation in detection data.

The noise clamping means comprises a digital comparator for comparing the size of the detection data having a constant level with that of predetermined second reference data that indicates a clamp level, and a selector circuit for outputting the detection data having a constant level as the data for the signal wave when the detection data having a constant level is smaller than the second reference data, and outputting the second reference data as the data for the signal wave when the detection data having a constant level is larger than the second reference data. Thus, even in case a large noise exceeding the clamp level is superimposed on the detection data having a constant level, the detection data having a constant level with the noise removed is generated.

The receiver comprises a digital multiplier for multiplying the first reference data by a predetermined scale factor so that the second reference data is generated. Thus, setting just the first reference data generates the second reference data of a predetermined scale factor. This simplifies operation for data setting.

What is claimed is:

1. A receiver comprising:
    a variable gain controller for performing variable gain adjustment of detection data generated by detection of a received wave that is frequency-converted to an intermediate frequency signal to the detection data having a constant level via digital signal processing, and a noise clamping section for performing noise clamping of the detection data having the constant level output from said variable gain controller via digital signal processing;

wherein said variable gain controller comprises:
- a digital low pass filter for integrating detection data to generate DC component data,
- a digital divider for dividing predetermined first reference data to indicate a detection data level by the DC component data generated by said digital low pass filter, and
- a digital multiplier for multiplying division data output from said digital divider via said division by the detection data to generate the detection data having a constant level.

2. A receiver comprising:

a variable gain controller for performing variable gain adjustment of detection data generated by detection of a received wave that is frequency-converted to an intermediate frequency signal to the detection data having a constant level via digital signal processing, and a noise clamping section for performing noise clamping of the detection data having the constant level output from said variable gain controller via digital signal processing;

wherein said noise clamping section comprises:
- a digital comparator for comparing predetermined second reference data to indicate a clamp level with the detection data having a constant level and outputting the comparison results, and
- a selector circuit for outputting the detection data having a constant level when the detection data having a constant level is smaller than the second reference data, and outputting the second reference data when the detection data having a constant level is larger than the second reference data.

3. The receiver according to claim 1, further comprising:

a digital multiplier for multiplying the first reference data by a predetermined scale factor so that the second reference data is generated; and wherein said noise clamping section comprises a digital comparator for comparing predetermined second reference data to indicate a clamp level with the detection data having a constant level and outputting the comparison results, and a selector circuit for outputting the detection data having a constant level a when the detection data having a constant level is smaller than the second reference data, and outputting the second reference data when the detection data having a constant level is larger than the second reference data.

4. The receiver of claim 2, wherein the data output from the selector circuit is signal wave data.

5. A receiver comprising:

a frequency converting circuit converting a received signal to an intermediate frequency signal;

a detection circuit generating a detection signal in an audio frequency band from said intermediate frequency signal;

an automatic gain controller circuit performing variable gain adjustment of said detection signal through digital signal processing thereby forming detection data having a constant level: and a noise clamping circuit performing noise clamping of the constant level detection data through digital signal processing;

wherein said automatic gain controller circuit comprises:
- a digital low pass filter for integrating detection data to generate DC component data,
- a digital dividing circuit for dividing predetermined first reference data to indicate a detection data level by the DC component data generated by said digital low pass filter, and
- a digital multiplier circuit for multiplying division data output from said digital dividing circuit via said division by the detection data to generate the detection data having a constant level.

6. A receiver comprising:

a frequency converting circuit converting a received signal to an intermediate frequency signal;

a detection circuit generating a detection signal in an audio frequency band from said intermediate frequency signal;

an automatic gain controller circuit performing variable gain adjustment of said detection signal through digital signal processing thereby forming detection data having a constant level; and a noise clamping circuit performing noise clamping of the constant level detection data through digital signal processing;

wherein said noise clamping circuit comprises:
- a digital comparator for comparing a predetermined second reference data with the detection data having a constant level and outputting the comparison results, and
- a selector circuit for selectively outputting the detection data having a constant level based on the comparison results of the digital comparator.

* * * * *